United States Patent
Hanada et al.

(10) Patent No.: US 6,292,124 B1
(45) Date of Patent: Sep. 18, 2001

(54) DELTA-SIGMA D/A CONVERTER

(75) Inventors: Yoshihiro Hanada, Yokohama; Akira Toyama, Chigasaki, both of (JP)

(73) Assignee: Nippon Precision Circuits, Inc., Tokyo (JP)

( * ) Notice: Subject to any disclaimer, the term of this patent is extended or adjusted under 35 U.S.C. 154(b) by 0 days.

(21) Appl. No.: 09/498,049

(22) Filed: Feb. 4, 2000

(30) Foreign Application Priority Data

Feb. 5, 1999 (JP) .................................................. 11-029170

(51) Int. Cl.⁷ ....................................................... H03M 1/66
(52) U.S. Cl. .............................................. 341/152; 341/143
(58) Field of Search ....................................... 341/143, 144, 341/152, 153, 154

(56) References Cited

U.S. PATENT DOCUMENTS

| | | | |
|---|---|---|---|
| 4,791,406 | * 12/1988 | Mehrgardt et al. | 341/144 |
| 4,972,188 | * 11/1990 | Clement et al. | 341/118 |
| 5,404,142 | * 4/1995 | Adams et al. | 341/144 |
| 5,610,606 | * 3/1997 | Fukunaga et al. | 341/143 |
| 5,760,726 | * 6/1998 | Koifman et al. | 341/145 |
| 5,856,799 | * 1/1999 | Hamasaki et al. | 341/144 |

OTHER PUBLICATIONS

Carley, A Noise Shaping coder Topology for 15+ Bit Converters, IEEE Journal of Solid State Circuits, vol. 24, No. 2, Apr. 1989, pp. 267–273.*

Leung, Architectures for Multi–Bit Oversampled A/D Converter Employing Dynamic Element Matching Techniques, IEEE International Sympoisum on Circuit and Systems, 1991., pp. 1657–1660.*

* cited by examiner

*Primary Examiner*—Howard L. Williams
(74) *Attorney, Agent, or Firm*—Schulte Roth & Zabel, LLP (57) ABSTRACT

A delta-sigma D/A converter has a quantizer, a thermometer code converter portion, and an odd/even bit-interchanging portion. The quantizer produces a first digital signal. The thermometer code converter portion and odd/even bit-interchanging portion divide the output level of the first digital signal such that it is represented by the sum of the output levels of second and third digital signals. Each of the second and third digital signals has an output level obtained by dividing the output level of the first digital signal by a factor of 2 or an integer close to it. During the former half of each sampling interval, first and second adders produce, respectively, a level signal corresponding to the second digital signal and an inverted level signal corresponding to an inversion of the third digital signal. During the latter half of the sampling interval, the adders produce, respectively, a level signal corresponding to the third digital signal and an inverted level signal corresponding to an inversion of the second digital signal. An operational amplifier subtracts the inverted level signal from the level signal and produces an analog signal corresponding to the output level of the first digital signal.

3 Claims, 4 Drawing Sheets

FIG. 1

THERMOMETER CODES

| BINARY CODES | | | SB1 | SB2 | SB3 | SB4 | SB5 | SB6 | SB7 | SB8 |
|---|---|---|---|---|---|---|---|---|---|---|
| B2 | B1 | B0 | | | | | | | | |
| 0 | 0 | 0 | 0 | 0 | 0 | 0 | 0 | 0 | 0 | 0 |
| 0 | 0 | 1 | 1 | 0 | 0 | 0 | 0 | 0 | 0 | 0 |
| 0 | 1 | 0 | 1 | 1 | 0 | 0 | 0 | 0 | 0 | 0 |
| 0 | 1 | 1 | 1 | 1 | 1 | 0 | 0 | 0 | 0 | 0 |
| 1 | 0 | 0 | 1 | 1 | 1 | 1 | 0 | 0 | 0 | 0 |
| 1 | 0 | 1 | 1 | 1 | 1 | 1 | 1 | 0 | 0 | 0 |
| 1 | 1 | 0 | 1 | 1 | 1 | 1 | 1 | 1 | 0 | 0 |
| 1 | 1 | 1 | 1 | 1 | 1 | 1 | 1 | 1 | 1 | 0 |

| INPUT VALUE TO THERMO. CODE | 0 | | 1 | | 2 | | 3 | | 4 | | 5 | | 6 | | 7 | |
|---|---|---|---|---|---|---|---|---|---|---|---|---|---|---|---|---|
| SAMP. INTERVAL | t=T | | t=2T | | t=3T | | t=4T | | t=5T | | t=6T | | t=7T | | t=8T | |
| FORMER/LATTER | T1 | T2 | T1 | T2 | T1 | T2 | T1 | T2 | T1 | T2 | T1 | T2 | T1 | T2 | T1 | T2 |
| P1 | 0 | 0 | 1 | 0 | 1 | 1 | 1 | 1 | 1 | 1 | 1 | 1 | 1 | 1 | 1 | 1 |
| N1 | 0 | 0 | 0 | 1 | 1 | 1 | 1 | 1 | 1 | 1 | 1 | 1 | 1 | 1 | 1 | 1 |
| P2 | 0 | 0 | 0 | 0 | 0 | 0 | 1 | 0 | 1 | 1 | 1 | 1 | 1 | 1 | 1 | 1 |
| N2 | 0 | 0 | 0 | 0 | 0 | 0 | 0 | 1 | 1 | 1 | 1 | 1 | 1 | 1 | 1 | 1 |
| P3 | 0 | 0 | 0 | 0 | 0 | 0 | 0 | 0 | 0 | 0 | 1 | 0 | 1 | 1 | 1 | 1 |
| N3 | 0 | 0 | 0 | 0 | 0 | 0 | 0 | 0 | 0 | 0 | 0 | 1 | 1 | 1 | 1 | 1 |
| P4 | 0 | 0 | 0 | 0 | 0 | 0 | 0 | 0 | 0 | 0 | 0 | 0 | 0 | 0 | 1 | 0 |
| N4 | 0 | 0 | 0 | 0 | 0 | 0 | 0 | 0 | 0 | 0 | 0 | 0 | 0 | 0 | 0 | 1 |
| $\Sigma P_i$ | 0 | 0 | 1 | 0 | 1 | 1 | 2 | 1 | 2 | 2 | 3 | 2 | 3 | 3 | 4 | 3 |
| $\Sigma N_i$ | 0 | 0 | 0 | 1 | 1 | 1 | 1 | 2 | 2 | 2 | 2 | 3 | 3 | 3 | 3 | 4 |
| $\Sigma P_i - \overline{\Sigma N_i}$ | 0 | 0 | 1 | 1 | 2 | 2 | 3 | 3 | 4 | 4 | 5 | 5 | 6 | 6 | 7 | 7 |
| TOTAL SUM | 0 | | 2 | | 4 | | 6 | | 8 | | 10 | | 12 | | 14 | |
| RP1 | | | ON | | ON | ON | ON | ON | ON | ON | ON | ON | ON | ON | ON | ON |
| RP2 | | | | | | | ON | | ON | ON | ON | ON | ON | ON | ON | ON |
| RP3 | | | | | | | | | | | ON | | ON | ON | ON | ON |
| RP4 | | | | | | | | | | | | | | | ON | |
| RN1 | ON | ON | ON | | | | | | | | | | | | | |
| RN2 | ON | ON | ON | ON | ON | ON | ON | | | | | | | | | |
| RN3 | ON | ON | ON | ON | ON | ON | ON | ON | ON | ON | ON | | | | | |
| RN4 | ON | ON | ON | ON | ON | ON | ON | ON | ON | ON | ON | ON | ON | ON | | ON |

| INPUT VALUE TO THERMO. CODE | 0 | | 1 | | 2 | | 3 | | 4 | | 5 | | 6 | | 7 | |
|---|---|---|---|---|---|---|---|---|---|---|---|---|---|---|---|---|
| SAMP. INTERVAL | t=T | | t=2T | | t=3T | | t=4T | | t=5T | | t=6T | | t=7T | | t=8T | |
| P1 | 0 | 0 | 1 | 0 | 0 | 0 | 0 | 0 | 1 | 1 | 1 | 0 | 0 | 1 | 1 | 1 |
| N1 | 0 | 0 | 0 | 1 | 0 | 0 | 0 | 0 | 1 | 1 | 1 | 1 | 0 | 0 | 1 | 1 |
| P2 | 0 | 0 | 0 | 0 | 1 | 0 | 0 | 0 | 0 | 1 | 1 | 1 | 1 | 0 | 1 | 1 |
| N2 | 0 | 0 | 0 | 0 | 1 | 1 | 0 | 0 | 0 | 0 | 1 | 1 | 1 | 1 | 0 | 1 |
| P3 | 0 | 0 | 0 | 0 | 0 | 1 | 1 | 0 | 0 | 0 | 1 | 1 | 1 | 1 | 1 | 0 |
| N3 | 0 | 0 | 0 | 0 | 0 | 0 | 1 | 1 | 0 | 0 | 0 | 1 | 1 | 1 | 1 | 1 |
| P4 | 0 | 0 | 0 | 0 | 0 | 0 | 1 | 1 | 1 | 0 | 0 | 0 | 1 | 1 | 1 | 1 |
| N4 | 0 | 0 | 0 | 0 | 0 | 0 | 0 | 1 | 1 | 1 | 0 | 0 | 1 | 1 | 1 | 1 |
|  |  |  |  |  |  |  |  |  |  |  |  |  |  |  |  |  |
| $\Sigma P_i$ | 0 | 0 | 1 | 0 | 1 | 1 | 2 | 1 | 2 | 2 | 3 | 2 | 3 | 3 | 4 | 3 |
| $\Sigma N_i$ | 0 | 0 | 0 | 1 | 1 | 1 | 1 | 2 | 2 | 2 | 2 | 3 | 3 | 3 | 3 | 4 |
| $\Sigma P_i - \Sigma N_i$ | 0 | 0 | 1 | 1 | 2 | 2 | 3 | 3 | 4 | 4 | 5 | 5 | 6 | 6 | 7 | 7 |
| TOTAL SUM | 0 | | 2 | | 4 | | 6 | | 8 | | 10 | | 12 | | 14 | |
|  |  |  |  |  |  |  |  |  |  |  |  |  |  |  |  |  |
| RP1 |  |  | ON |  |  |  |  |  | ON | ON | ON |  |  | ON | ON | ON |
| RP2 |  |  |  | ON |  |  |  |  |  | ON | ON | ON | ON |  | ON | ON |
| RP3 |  |  |  |  | ON | ON |  |  |  |  | ON | ON | ON | ON | ON |  |
| RP4 |  |  |  |  |  |  | ON | ON | ON |  |  |  | ON | ON | ON | ON |
|  |  |  |  |  |  |  |  |  |  |  |  |  |  |  |  |  |
| RN1 | ON | ON | ON |  | ON | ON | ON | ON |  |  |  |  | ON | ON |  |  |
| RN2 | ON | ON | ON | ON |  |  | ON | ON | ON | ON |  |  |  |  | ON |  |
| RN3 | ON | ON | ON | ON | ON | ON |  |  |  |  | ON | ON | ON |  |  |  |
| RN4 | ON | ON | ON | ON | ON | ON | ON |  |  |  |  |  | ON | ON |  |  |

FIG. 8 (PRIOR ART)

DELTA-SIGMA D/A CONVERTER

BACKGROUND OF THE INVENTION

1. Field of the Invention

The present invention relates generally to a delta-sigma digital-to-analog (D/A) converter capable of performing D/A conversion with high accuracy and a high signal-to-noise ratio (S/N) and, more particularly, to a delta-sigma digital-to-analog converter designed to convert the output of a quantizer having a plurality of quantization levels into analog form.

2. Description of the Related Art

Figure 7:
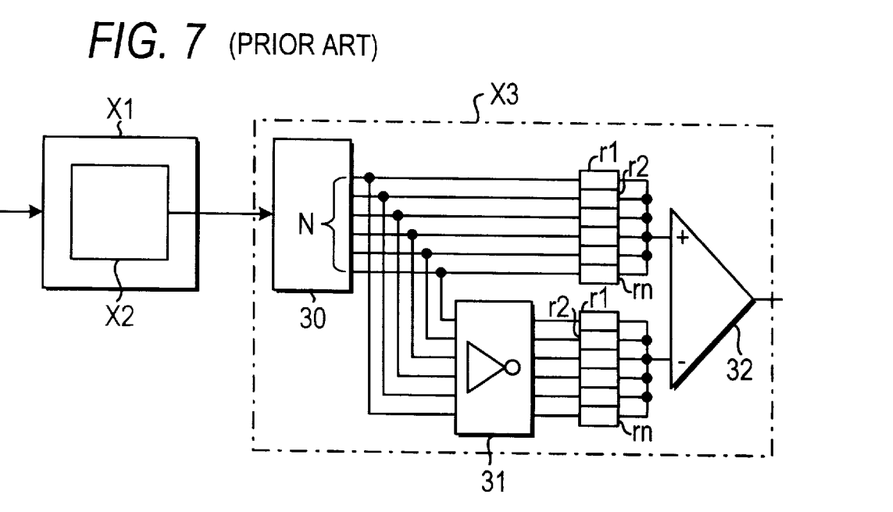
FIG. 7 is a block diagram of the prior art delta-sigma D/A converter.
Figure 8:
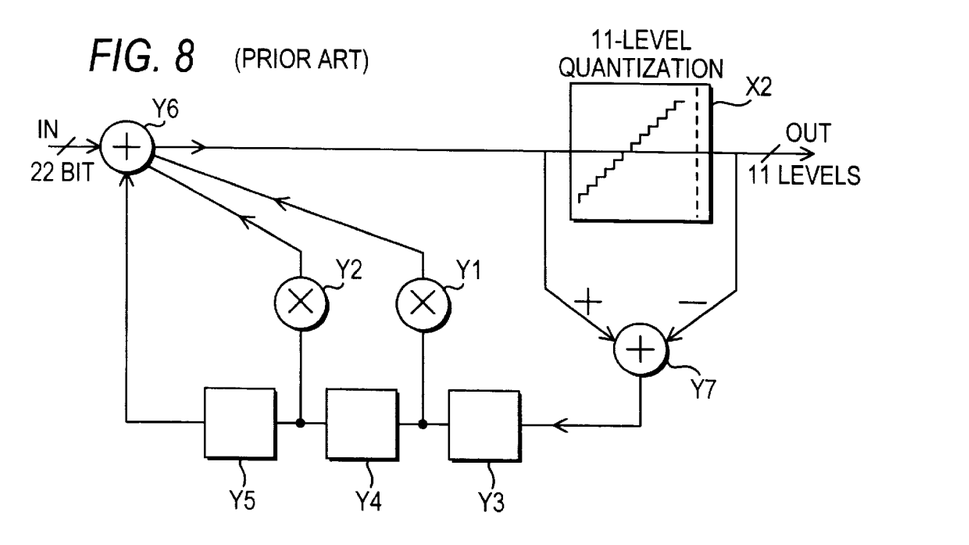
FIG. 8 is a circuit diagram of main portions of the prior art delta-sigma D/A converter shown in FIG. 7.

Some digital audio devices, such as compact disk (CD) players, use delta-sigma modulation D/A converters. Such a converter oversamples a multibit digital signal read from a CD, converts it into a multilevel digital signal, and converts this digital signal to analog form. For example, as shown in FIG. 7, the converter includes a noise shaper X1 that receives a multibit digital signal, implements noise shaping, and cancels out low-frequency components of quantization noise produced by a quantizer, as described later herein. A quantizer X2 is included in the noise shaper X1 and acts to compare the input with plural levels and to implement multi-level quantization. The converter further includes a local D/A converter X3 for converting the digital output from the quantizer into analog form. For example, a third-order noise shaper, shown in FIG. 8, is one example of a noise shaper and consists of multipliers Y1 and Y2; delay circuits Y3, Y4, and Y5; and adders Y6 and Y7. Each of the delay circuits Y3, Y4, and Y5 introduces a delay of one sampling interval. These delay circuits are connected in cascade. The inputted multibit digital signal is summed by the adder Y6 with the output from the delay circuit Y5 and with the outputs from the delay circuits Y3 and Y4 which are multiplied by coefficients "3" and "−3", respectively, via the multipliers Y1 and Y2, respectively. The output from the adder Y6 is fed to the quantizer X2. The output from the quantizer X2 is subtracted from the input by the adder Y7 and applied to the delay circuit Y3. In FIG. 8, a 22-bit digital signal at the input is converted to a 11-level digital signal.

To obtain high accuracy and a high S/N ratio from a conventional delta-sigma D/A converter, it is theoretically necessary that the order of the noise shaper, the sampling frequency, and the number of quantization levels of the quantizer be increased. Increasing the order of the noise shaper will increase the number of sets of integrators forming the noise shaper, multipliers, and delay circuits. This will increase the size of the circuitry. If the order of the noise shaper is increased greatly, noise at high frequencies will be increased. If the sampling frequency is increased, the system clock frequency of the digital audio system will be increased. As a result, the device is more vulnerable to clock jitter. Furthermore, the cost is increased. Additionally, the power consumption is increased. In addition, there is a danger of generation of interference with the analog audio circuit portion of the audio system. Hence, the conventional delta-sigma D/A scheme has limitations. Therefore, it is essential to increase the number of quantization levels of the quantizer.

The local D/A converter of the delta-sigma modulation system has a resolution of only tens of levels according to the number of output levels of the quantizer. However, the value of each level is required to have a very high relative accuracy. For example, where an accuracy exceeding 16 bits is required, if resistors, capacitors, and so on are simply arrayed as D/A converter elements, the strict requirement on the relative accuracy cannot be satisfied because of variations among the converter elements due to the semiconductor fabrication process used for fabrication of the integrated circuits (ICs) for D/A converters. Consequently, a local D/A converter of the PWM (pulse-width modulation) or DEM (dynamic element matching) type is used, in addition to an increased number of quantization levels of the quantizer.

In the PWM system, plural levels are represented by varying the pulse width of one sampling interval. The conversion accuracy is mainly determined by the clock accuracy taken along the time axis. Therefore, the conversion accuracy is hardly affected by the fabrication errors introduced in manufacturing ICs and so on. Hence, the PWM system has the advantage that high accuracy can be accomplished easily. On the other hand, a high system clock frequency that is more than double the sampling frequency is necessary. Furthermore, PWM has the disadvantage that the conversion accuracy is greatly affected by clock jitter.

The DEM system is a D/A converter that has conversion elements which consist of resistors and capacitors that have the same conversion capability, according to the output level of a quantizer. In particular, the D/A converter shown in FIG. 7 comprises a DEM converter 30, 2N resistors r1–r12, an inverter portion 31, and an operational amplifier 32. The DEM converter 30 has N outputs corresponding to the number of output levels N of the quantizer X2. The resistors r1–r12 are converter elements and have the same resistance value. The DEM converter 30 supplies a unit amount of current to selected ones of resistors r1–rN and r'1–r'N. The number of the energized resistors corresponds to the output level of the quantizer X2. The amounts of current supplied to the resistors are summed up in an analog manner and supplied to the operational amplifier 32 to produce an analog output corresponding to the output level of the quantizer X2. The DEM method does not need a conversion clock frequency higher than the sampling frequency, unlike the PWM method. Since this system has analog conversion elements, such as resistors and capacitors, the conversion accuracy is deteriorated by the inconsistencies among the elements. In the DEM system, the elements are used in turn. On average, all elements are used during the same time. This moves noise components due to inconsistencies among the conversion elements to higher frequencies. As a result, a high conversion accuracy is accomplished for low-frequency components that are used in practice.

However, the DEM system has the disadvantage that the IC chip area is increased because many conversion elements such as resistors and capacitors are used. This leads to an increase in the cost. Furthermore, inputs that are inverted in level with respect to each other are applied respectively to non-inverting and inverting input terminals of the operational amplifier 32 shown in FIG. 7. That is, a differential input system is adopted. Consequently, the number of the necessary converter elements reaches twice the number N of the quantization levels.

SUMMARY OF THE INVENTION

Accordingly, in the embodiments of the present invention, each sampling interval of a quantizer is divided into a former half and a latter half. The output level of the quantizer is divided such that it is expressed by the sum of output levels of second and third digital signals, each of which is obtained by dividing the first-mentioned output level to a half of it or an integer close to a half of it. In the former half of the sampling interval, an inverted level signal obtained by inverting the third digital signal is subtracted from a level signal corresponding to the second digital signal. In the latter half of the sampling interval, an inverted level signal obtained by inverting the second digital signal is subtracted from a level signal corresponding to the third digital signal, thus producing an analog signal. The number of elements such as resistors and capacitors forming the conversion elements is halved compared with the prior art DEM system simply by using a clock frequency that is double the sampling frequency. In other words, for the same number of elements, a more accurate D/A converter is accomplished.

The embodiments of the present invention provide a delta-sigma D/A converter comprising a quantizer, a noise shaper, a divider, and a differential amplifier. The quantizer produces a first digital signal, whose output level is varied among plural levels, at regular sampling intervals. The number of the output levels of the quantizer is given by N, which is an integer equal to or greater than 3. The noise shaper cancels out low-frequency components of quantization noise produced from the quantizer. The divider divides the first digital signal such that it is represented by the sum of the output levels of the second and third digital output signals, each of which indicates a fraction of the output level of the first digital signal obtained by dividing this output level to a half of it or an integer close to a half of it. In the former half of each sampling interval, the differential amplifier subtracts an inverted level signal obtained by inverting a level signal corresponding to the third digital signal from a level signal corresponding to the second digital signal. In the latter half of each sampling interval, the differential amplifier subtracts a level signal obtained by inverting a level signal corresponding to the second digital signal from a level signal corresponding to the third digital signal. In this way, the differential amplifier produces an analog signal corresponding to the output level of the quantizer.

According to the embodiments of the present invention, Q (where Q is an integer that is given by (N−1) and is greater than 0) is the output level of the first digital signal. Where Q is even, the divider preferably divides the first digital signal such that the output levels A and B of the second and third digital signals, respectively, are set to Q/2. Where Q is odd, the divider preferably divides the first digital signal such that the output levels A and B are set to (Q+1)/2 and (Q−1)/2, respectively.

Preferably, the delta-sigma D/A converter is equipped with a first adder having L (where L is an integer equal to or greater than (N−1)/2) converter elements weighted equivalently to each other and with a second adder having L converter elements weighted equivalently to each other. In the former half of each sampling interval, the first adder receives the second digital signal, supplies a unit amount to A converter elements corresponding to the level A of the second digital signal to add the unit amount in an analog manner, and generates the aforementioned level signal corresponding to the second digital signal. In the latter half of each sampling interval, the first adder receives the third digital signal, supplies the unit amount to B converter elements corresponding to the level B of the third digital signal to add the unit amount, and generates the level signal corresponding to the third digital signal. In the former half of the sampling interval, the second adder receives the third digital signal, supplies the unit amount to (L−B) converter elements corresponding to the level B of the third digital signal to add the unit amount in an analog manner, and generates an inverted level signal corresponding to the third digital signal. In the latter half of the sampling interval, the second adder receives the second digital signal, supplies the unit amount to (L A) converter elements corresponding to the level A of the second digital signal to add the unit amount in an analog manner, and generates the inverted level signal corresponding to the second digital signal.

The above, and other features, aspects, and advantages of the present invention will become apparent from the following description read in conjunction with the accompanying drawings, in which like reference numerals designate the same elements.

DESCRIPTION OF THE PREFERRED EMBODIMENTS

Figure 1:
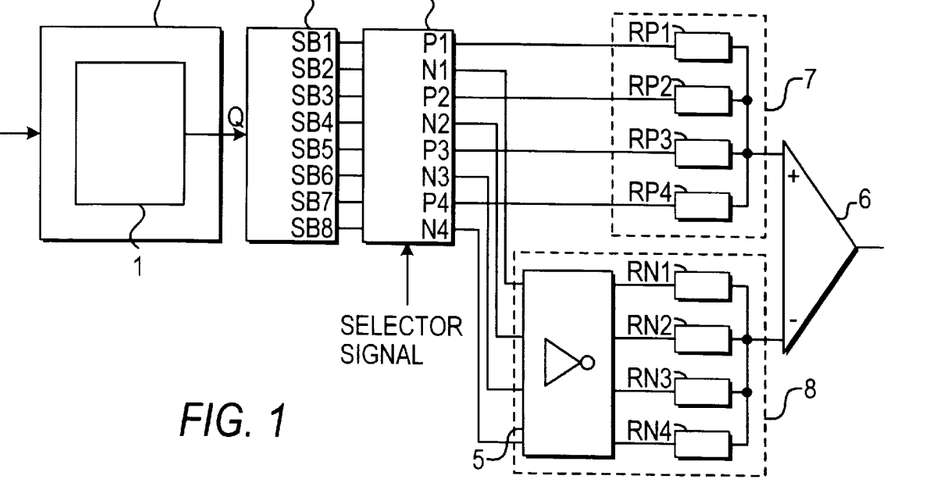
FIG. 1 is a block diagram of a delta-sigma D/A converter in accordance with a first embodiment of the present invention.

A delta-sigma D/A converter in accordance with an embodiment of the present invention is described with reference to FIG. 1. This converter includes a quantizer 1 and a noise shaper 2, both of which are of conventional constructions, as shown in FIG. 8. The noise shaper 2 can be either a third-order noise shaper or a second-order noise shaper. The number of output levels of the quantizer is 11. The number of the output levels may also be three or more. In the following description, it is assumed for convenience that the number N of the output levels of the quantizer 1 is eight. The noise shaper 2 receives a multibit digital signal and implements noise shaping at regular sampling intervals T to cancel out low-frequency components of quantization noise produced from the quantizer 1. This quantizer 1 quantizes the results of the noise shaping at regular sampling intervals and produces a first digital signal having plural output levels.

Figure 2:
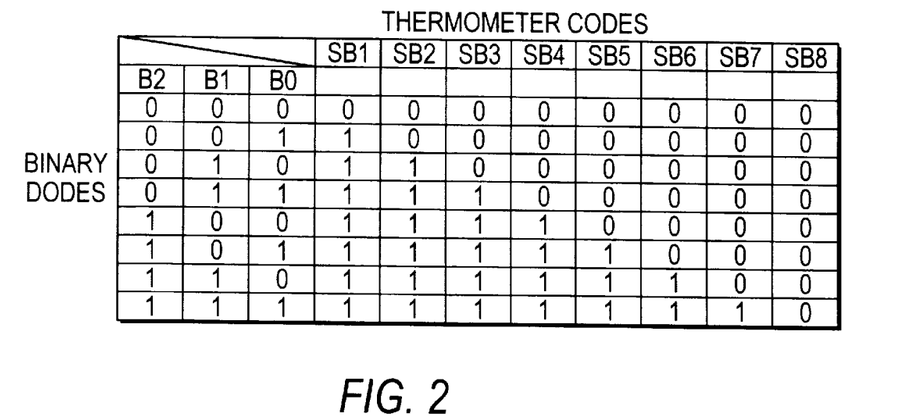
FIG. 2 is a table illustrating the operation of the delta-sigma D/A converter shown in FIG. 1.

The converter further includes a thermometer code converter portion 3 having output terminals SB1–SB8. The number N (which is equal to 8 in the present embodiment) of the output terminals is equal to the number N of the output levels of the quantizer 1. The code converter portion 3 selects Q outputs according to the output level Q from the quantizer 1 and sets the selected outputs 10 to "1". As shown in FIG. 2, the output terminals SB1–SB7 are set, in turn, to "1" in response to the binary codes 001 to 111 corresponding to the output level Q from the quantizer 1. For example, at the binary code 001, the output terminal SB1 is set to "1". At the binary code 010, the output terminals SB1 and SB2 are set to "1". The output terminal SB8 is kept at "0".

An even/odd bit-interchanging portion 4 is equipped with output terminals P1–P4 and N1–N4. In the initial state, the output terminals P1, N1, P2, N2, P3, N3, P4, and N4 deliver the outputs from the output terminals SB1–SB8 intact. The even/odd bit-interchanging portion 4 interchanges odd and even bits of the outputs from the output terminals SB1–SB8 according to a selector signal that is inverted at halves of the sampling intervals. This interchange is done in the manner described below. When the selector signal is a "1", the inputs and outputs are maintained in the initial states. When the selector signal is a "0", the input signals to the output terminals P1 and N1 are interchanged. The input signals to the output terminals P2 and N2 are interchanged. The input signals to the output terminals P3 and N3 are interchanged. The input signals to the output terminals P4 and N4 are interchanged. Thus, second and third digital signals are alternately produced from the output terminals PI–P4 and output terminals N1–N4 at halves of the sampling intervals. The second and third digital signals show output levels obtained by dividing the output level Q by a factor of 2 or an integer close to it.

RP1–RP4 and RN1–RN4 are resistors that are converter elements, and have the same resistance value. These resistors are weighted equivalently. Capacitors may also be used as the converter elements. The converter further includes an inverter portion 5 and an operational amplifier 6 acting as a differential amplifier. One terminal of each of the resistors RP1–RP4 is connected with the output terminals P1–P4 of the odd/even bit-interchanging portion 4, while their other terminals of the resistors RP1–RP4 are connected together and to the non-inverting input terminal of the operational amplifier 6. Thus, a given current is supplied as a unit amount to the resistors RP1–RP4 according to state "1" of the output terminals P1–P4. These unit amounts are summed up and supplied to the non-inverting input terminal of the operational amplifier 6. The sum of these unit amounts gives a level signal corresponding to the second or third digital signal. One terminal of each of the resistors RN1–RN4 is connected via the inverter portion 5 to the output terminals N1–N4 of the odd/even bit-interchanging portion 4, while their other terminals of the resistors RN1–RN4 are connected together and to the inverting input terminal of the operational amplifier 6. Thus, a given amount of current is supplied as a unit amount to the resistors in response to state "0" of the output terminals N1–N4. The sum of these unit amounts gives an inverted level signal that is obtained by inverting a level signal corresponding to the second or third digital signal. This inverted level signal is fed to the inverting input terminal of the operational amplifier 6. That is, the resistors RP1–RP4 together form a first adder 7. The inverter portion 5 and the resistors RN1–RN4 together form a second adder 8. Each of the first and second adders 7 and 8, respectively, has L (which is equal to 4 in the present embodiment) converter elements. The first adder 7 sums up A unit amounts in the former half of the sampling interval and B unit amounts in the latter half of the sampling interval in response to the output level values A and B, respectively, of the second and third digital signals. The second adder 8 sums up (L-B) unit amounts in the former half of the sampling interval and (L-A) unit amounts in the latter half of the sampling interval. The operational amplifier 6 subtracts the inverted level signal from the level signal, thus producing an analog signal corresponding to the output level of the quantizer 1.

Figure 3:
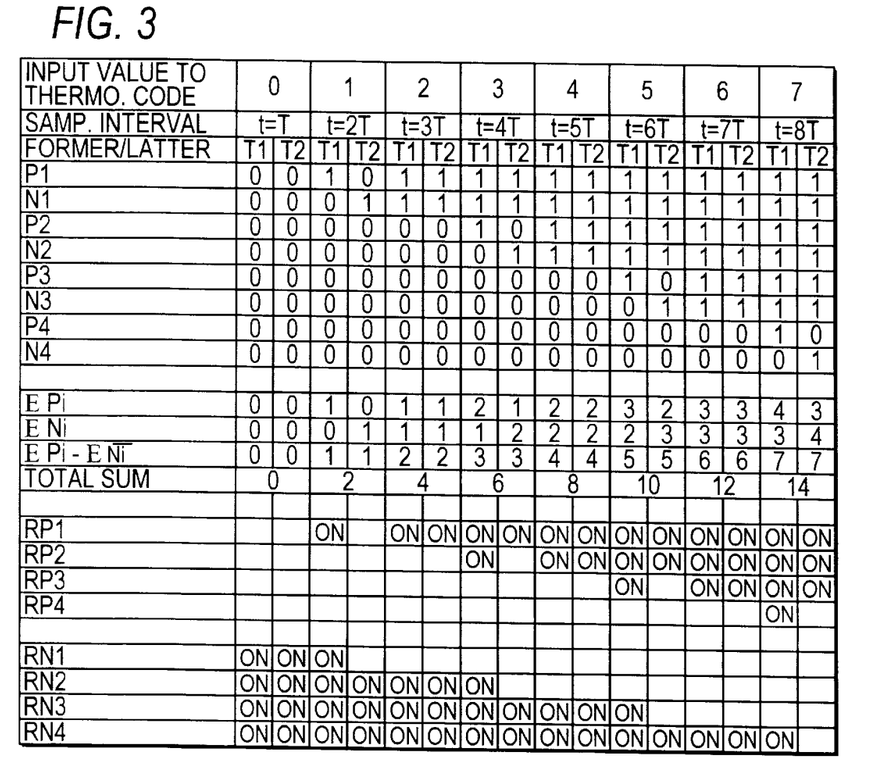
FIG. 3 is a table illustrating the operation of the delta-sigma D/A converter shown in FIG. 1.
Figure 4:
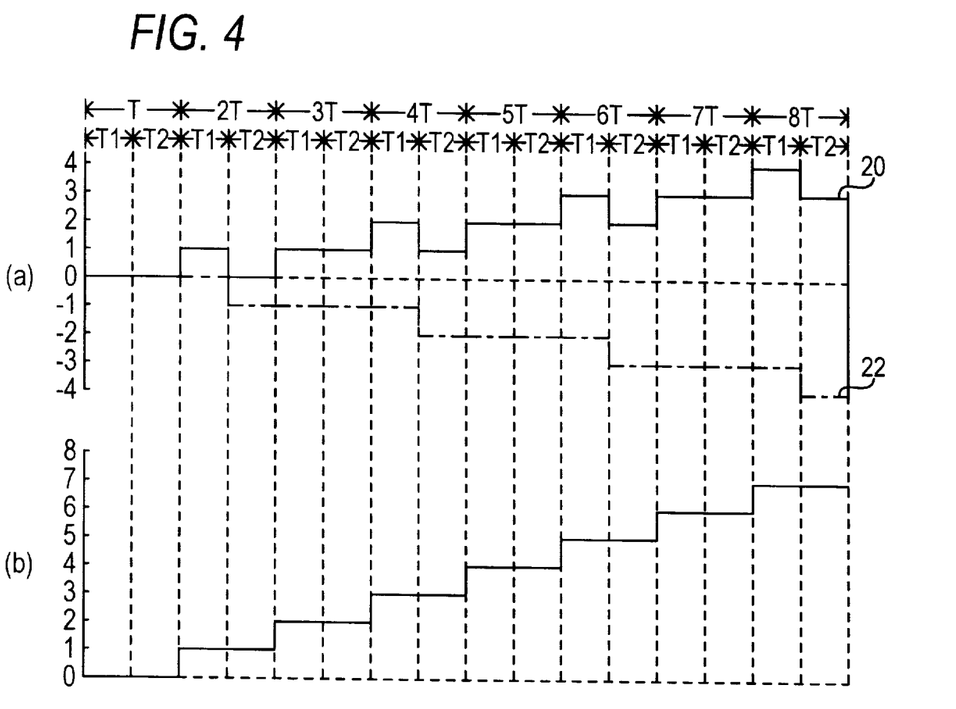
FIGS. 4(a) and 4(b) are diagrams illustrating the operation of the delta-sigma D/A converter shown in FIG. 1.

The operation of the present embodiment is described by referring to FIGS. 3 and 4, assuming that the output level of the quantizer 1 (i.e., the output value indicated by a thermometer code) increases from 0 to 7, in turn, in the first through eighth sampling intervals T–8T. FIG. 3 shows the output values of the thermometer code converter portion 3, the states of outputs of the output terminals P1–P4 and N1–N4 of the odd/even bit-interchanging portion 4, and their sums $\Sigma$ Pi and $\Sigma$ Ni. Also, an added value $\Sigma Pi - \Sigma Ni$ that is obtained from the operational amplifier 6 by subtracting the inverted level signal from the level signal (i.e., the output signal from the operational amplifier 6) at half sampling intervals is shown. Furthermore, the total sum of unit amounts summed up by the operational amplifier 6 over one interval is shown. The supply of a unit amount of current to the resistors RP1–RP4 and RN1–RN4 is indicated in FIG. 3 by the use of the word "on."

In FIG. 4(a), the level signal fed to the non-inverting input terminal if the operational amplifier 6 in the first interval T through the eighth interval 8T is indicated by the numeral 20. The inverted level signal fed to the inverting input terminal is indicated by the numeral 22. Shown in FIG. 4(b) is an analog signal delivered from the operational amplifier 6.

In the first sampling interval T, the output level of the quantizer 1 is "0". The output levels SB1–SB8 of the thermometer code converter portion 3 are all in state "0". These output levels are delivered intact from the output terminals P1, N1, P2, . . . , N4 of the odd/even bit-interchanging portion 4 during the former half T1 of the interval T. As shown in FIG. 3, the output terminals P1, N1, P2, . . . , N4 all take state "0". Therefore, the output terminals P1, P2, P3, and P4 are delivering "0", "0", "0", and "0" respectively, and their sum $\Sigma$ Pi indicates the output level of the second digital signal. In this example, the output level is "0". Therefore, a unit amount of current corresponding to the output level "0" is added in the first adder 7. That is, no unit amount of current is supplied to the resistors RP1 to RP4. The level signal indicating the sum $\Sigma$ Pi assumes 0 level as shown in FIG. 4(a). The output terminals N1, N2, N3, and N4 are all delivering "0", and their sum $\Sigma$ Ni indicates the output level of the third digital signal. In this example, the output level is "0". Therefore, four unit amounts of current are added in the second adder 8. That is, the states of the output terminals N1, N2, N3, and N4 are inverted into state "1" by the inverter portion 5. A unit amount of current is supplied to all the resistors RN1–RN4. The sum of the states of the output terminals N1, N2, N3, and N4, which indicates a level signal, assumes the level "0", as shown in FIG. 4(b). Consequently, the sum $\Sigma Pi - \Sigma Ni$ of the operational amplifier 6 is at level "0". As shown in FIG. 4(b), an analog signal of level "0" is produced.

In the latter half T2 of the interval T, the odd/even bit-interchanging portion 4 interchanges even and odd bits. The outputs from the output terminals SB1–SB8 of the thermometer code converter portion are delivered from the output terminals N1, P1, N2, P2–N4, and P4. Since the outputs from the output terminals SB1–SB8 are all "0", the analog signal delivered from the operational amplifier 6 is at level "0" in the same way as in the former half T1 of the sampling interval.

In the second sampling interval 2T, the output level of the quantizer 1 is "1". The output terminal SB1 of the thermometer code converter portion 3 is "1". The states of the output terminals SB2–SB8 remain at "0". These are delivered intact from the output terminals P1, N1, P2, . . . , N4 of the odd/even bit-interchanging portion 4 in the former half T1 of the interval. As shown in FIG. 3, the output terminals P1, P2, P3, and P4 deliver "1,", "0", "0", and "0", respectively, and their sum $\Sigma Pi$ is "1". In the first adder 7, a unit amount of current corresponding to state "0" is added. A unit amount of current is supplied from the output terminal P1 only to the resistor RP1. As shown in FIG. 4(a), the level signal 20 assumes level "1". The output terminals N1, N2, N3, and N4 all deliver state "0", and their sum ΣNi is "0". A unit amount of current is supplied to each of the resistors RN1–RN4. An inverted level signal 22 obtained by summing the states of the output terminals N1, N2, N3, and N4 assumes level "0", as shown in FIG. 4(a). Consequently, the sum ΣPi–ΣNi of the operational amplifier 6 is at level "1". As shown in FIG. 4(b), the operational amplifier 6 produces an analog signal of level "1".

In the latter half T2 of the interval 2T, the odd/even bit-interchanging portion 4 interchanges the odd and even bits. The output terminals P1, P2, P3, and P4 all produce "0", and their sum Σ Pi is "0". The output terminals N1, N2, N3, and N4 produce "1", "0", "0", and "0", respectively, and their sum Σ Ni is "1". The state of the output terminal N1 is "1". This state is inverted into state "0" by the inverter portion 5. The supply of a unit amount of current to the resistor RN1 ceases. The amount of current supplied to the resistors RN1–RN4 decreases by one unit. The inverted level signal 22 obtained by summing the states of the output terminals N1, N2, N3, and N4 assumes level "–1" as shown in FIG. 4(a). The sum Σ Pi is 0. Also shown in FIG. 4(a), the level signal 20 is at level "0". Consequently, the sum ΣPi–ΣNi of the operational amplifier 6 is at level "1", in the same way as in the former half T1. As shown in FIG. 4(b), the operational amplifier 6 produces an analog signal of level "1". The total sum of unit amounts of current over the whole interval is 2.

In the third sampling interval 3T, the output level of the quantizer 1 is "2". The output terminals SB1 and SB2 of the thermometer code converter portion 3 take state "1". The states of the output terminals SB3–SB8 remain at "0". In the former half T1 of the interval 3T, the states of the output terminals SB1–SB8 are delivered intact from the output terminals P1, N1, P2–N4 of the odd/even bit-interchanging portion 4. As shown in FIG. 3, the output terminals P1, P2, P3, and P4 produce "1", "0", "0", and "0", respectively, and their sum Σ Pi is "1". A unit amount of current is supplied from the output terminal P1 to the resistor RP1. As shown in FIG. 4(a), the level signal 20 assumes level "1". The output terminals N1, N2, N3, and N4 deliver "1", "0", "0", and "0", respectively, and their sum ΣNi is "1". The state of the output terminal Ni is inverted into "0" by the inverter portion 5. The supply of a unit amount of current to the resistor RN1 ceases. A unit amount of current is supplied to the resistors RN2–RN4. The inverted level signal 22 indicated by the sum of the states of the output terminals N1–N4 assumes level "–1", as shown in FIG. 4(a). As a result, the sum ΣPi–ΣNi of the operational amplifier 6 assumes level 2. As shown in FIG. 4(b), the operational amplifier 6 produces an analog signal of level 2.

In the latter half T2 of the interval 3T, the odd/even bit-interchanging portion 4 interchanges odd and even bits. The supply of a unit amount of current to the resistors RP2–RP4 and RN2–RN4 remains unchanged. As shown in FIG. 4(a), the level signal 20 and the inverted level signal 22 assume levels "1" and "–1", respectively. In the same way as in the former half Ti, the sum ΣPi–ΣNi of the operational amplifier 6 produces an analog signal of level 2, as shown in FIG. 4(b). The total sum of unit amounts of current over the whole interval is 4.

In the fourth sampling interval 4T, the output level of the quantizer 1 is "3". The output terminals SB1, SB2, and SB3 of the thermometer code converter portion 3 assume state "1". The states of the output terminals SB4–SB8 remain in state "0". In the former half T1 of the interval 4T, these states are delivered intact from the output terminals P1, N1, P2, . . . , N4 of the odd/even bit-interchanging portion 4. As shown in FIG. 3, the output terminals P1, P2, P3, and P4 produce "1", "1", "0", and "0", respectively, and their sum Σ Pi is 2. Unit amounts of current are supplied to the resistors RP1 and RP2 from the output terminals P1 and P2, respectively. As shown in FIG. 4(a), the level signal 20 assumes level 2. The output terminals N1, N2, N3, and N4 deliver "1", "0", "0", and "0", respectively, and their sum Σ Ni is "1". The state of the output terminal N1 is inverted into state "0" by the inverter portion 5. The supply of unit amounts of current to the resistor RN1 ceases. Unit amounts of current are supplied to the resistors RN2–RN4. The inverted level signal 22 arising from sum of the states of the output terminals N1–N4 assumes level "–1", as shown in FIG. 4(a). In consequence, the sum ΣPi–ΣNi produced from the operational amplifier 6 assumes level "3". As shown in FIG. 4(b), the operational amplifier 6 produces an analog output of level "3".

In the latter half T2 of the interval 4T, the even/odd bit-interchanging portion 4 interchanges odd and even bits. As shown in FIG. 3, the output terminals P1, P2, P3, and P4 deliver "1", "0", "0", and "0", respectively, and their sum Σ Pi is "1". The supply of unit amounts to the resistor RP2 ceases. As shown in FIG. 4(a), the level signal 20 takes level "1". The output terminals N1, N2, N3, and N4 deliver "1", "1", "0", and "0", respectively. The sum Σ Ni of them is 2. The supply of unit amounts to the resistor RN2 ceases. As shown in FIG. 4(a), the inverted level signal assumes level "–2". In the same way as in the former half T1, the sum ΣPi–ΣNi produced from the operational amplifier 6 assumes level "3". As shown in FIG. 4(b), the operational amplifier 6 produces an analog output signal of level "3". The total sum of unit amounts of current over the whole interval is 6.

Subsequently, the level signal 20 and the inverted level signal 22 similarly assume levels "2" and "–2", respectively, in both halves T1 and T2 of the fifth sampling interval 5T in which the output level of the quantizer 1 is "4". The analog signal assumes level "4".

In the former half T1 of the sixth sampling interval 6T, in which the output level of the quantizer 1 is "5", the level signal 20 and the inverted level signal 22 similarly assume levels "2" and "–3", respectively, and the analog signal takes level "5".

In both halves T1 and T2 of the seventh sampling interval 7T, in which the quantizer 1 produces an output level "6", the level signal 20 and the inverted level signal 22 assume levels "3" and "–3", respectively, and the analog signal takes on level "6".

In the former half T1 of the eighth sampling interval 8T, in which the quantizer 1 produces an output level "7", the level signal 20 and the inverted level signal 22 assume levels "4" and "–3", respectively. The analog signal assumes level "7". In the latter half T2, the level signal 20 and the inverted level signal 22 assume levels "3" and "–4", respectively, and the analog signal takes on level "7".

The operation of the present embodiment is summarized as follows. The output terminals SB1–SB8 of the thermometer code converter portion 3 are divided into an odd-numbered group and an even-numbered group by the odd/even bit-interchanging portion 2. In the former half of each sampling interval, signals produced from output terminals belonging to the odd-numbered group are applied to the first adder 7. Signals produced from output terminals belonging to the even-numbered group are applied to the second adder 8. Where the output level Q of the quantizer 1 is odd, the first adder 7 adds unit amounts (Q+1)/2. Where the output level is even, the first adder 7 adds unit amounts Q/2. Thus, a level signal is produced. Where the output level is odd, the second adder 8 adds unit amounts (Q−1)/2. Where the level is even, the second adder adds unit amounts Q/2. An inverted level signal corresponding to an inversion of the obtained signal is produced. These signals are applied to the non-inverting input terminal and the inverting input terminal, respectively, of the operational amplifier 6, and an analog signal corresponding to the output level Q is produced. In the latter half of the sampling interval, the odd-numbered group and the even-numbered group are interchanged. Signals produced from the output terminals belonging to the even-numbered group are applied to the first adder 7. Signals produced from the output terminals belonging to the odd-numbered group are applied to the second adder 8. Where the output level Q of the quantizer 1 is odd, the first adder 7 adds unit amounts (Q−1)/2. Where the output level Q is even, the first adder adds unit amounts Q/2, and a level signal is produced. The second adder adds unit amounts (Q+1)/2 where the level is odd. The second adder adds unit amounts Q/2 where the level is even. The resulting level signal is inverted, thus producing the inverted level signal. These signals are applied to the non-inverting input terminal and the inverting input terminal, respectively, of the operational amplifier 6, thus producing an analog output signal corresponding to the output level Q.

In the present embodiment, the number of converter elements for the addition of unit amounts of current (e.g., resistors and capacitors) can be halved compared with the prior art differential D/A converter. Furthermore, the balance error between the non-inverting and inverting input terminals of the operational amplifier 6 is zero or a unit amount, depending on whether Q is even or odd, respectively. In this way, the error is small because the absolute values of the levels applied to the non-inverting and inverting input terminals, respectively, are interchanged at half sampling intervals. Hence, the balance error is canceled out at every sampling interval because the balance errors and noises in the former and latter halves are mutually canceled out. This can prevent the audible band from being affected.

Figure 5:
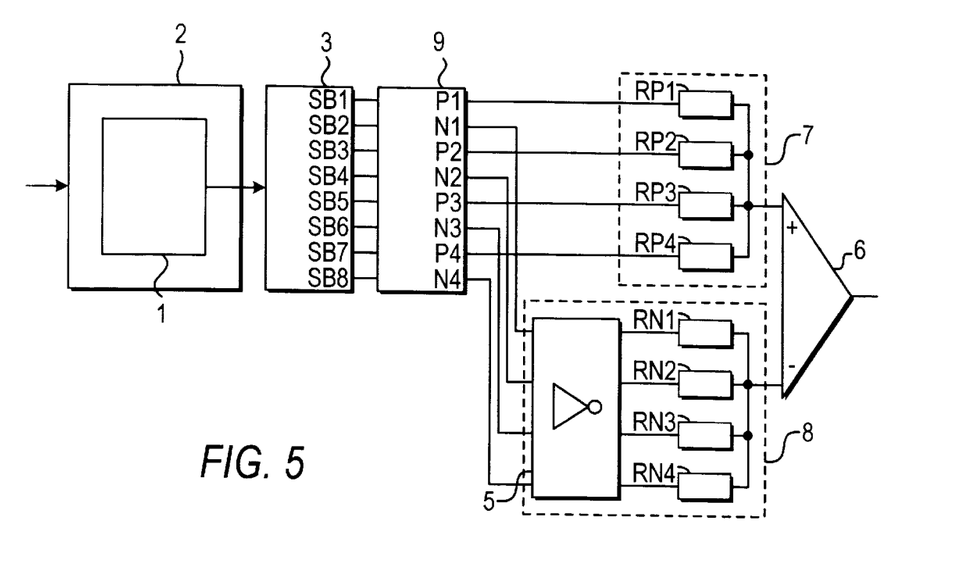
FIG. 5 is a block diagram of a delta-sigma D/A converter accordance with a second embodiment of the present invention.

A second embodiment of the invention is next described. In the first embodiment described above, the absolute values of the levels applied to the non-inverting and inverting input terminals, respectively, of the operational amplifier 6 are interchanged at half sampling intervals using the odd/even bit-interchanging portion 4. The present invention is not limited to this method. In the second embodiment of the present invention, a barrel shifter portion is mounted instead of the odd/even bit-interchanging portion 4. The configuration of the second embodiment is illustrated in FIG. 5. Note that like components are indicated by like reference numerals in both FIGS. 1 and 5.

Referring to FIG. 5, the barrel shifter portion 9 receives outputs from the output terminals SB1–SB8 of the thermometer code converter portion 3. Like the odd/even bit-interchanging portion 4, the barrel shifter portion 9 has the same number of output terminals as the output terminals SB1–SB8. For convenience, these output terminals are denoted by like reference numerals, i.e., P1, N1, P2, N2, P3, N3, P4, and N4, respectively. In the initial state, the barrel shifter portion 9 produces signals from the output terminals P1, Ni, P2, N2, P3, N3, P4, and N4 to indicate the states of the output terminals SB1, SB2, SB3, SB4, SB5, SB6, SB7, and SB8, respectively. During a half of the next sampling interval, signals indicating the states of the output terminals SB8, SB1, SB2, SB4, SB5, SB6, and SB7, respectively, are produced. During the further next sampling half interval, signals indicating the states of the output terminals SB7, SB8, SB1, SB2, SB3, SB4, SB5, and SB6 are produced. In this way, the output terminals producing output signals in response to inputs are cyclically shifted at halves of sampling intervals. As a result, every converter element (i.e., the resistors RP1–RP4 and RN1–RN4) is used for a uniform time.

Figure 6:
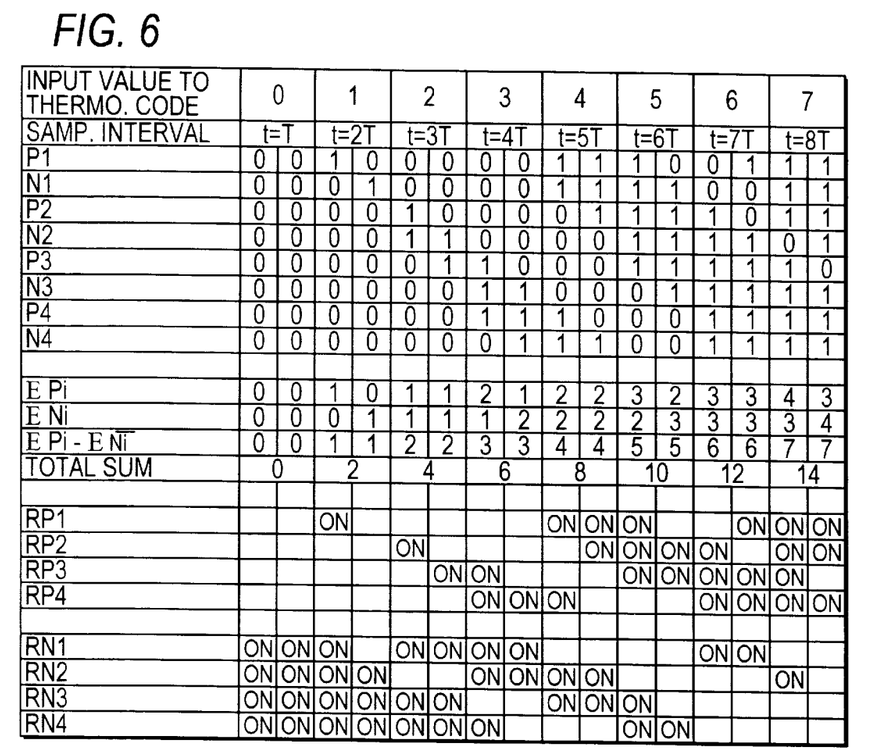
FIG. 6 is a table illustrating the operation of the delta-sigma D/A converter shown in FIG. 5.

The operation of the present embodiment is similar to the operation of the first embodiment, except for the operation of the barrel shifter portion 9. The states of the output terminals and unit amounts of current added are shown in FIG. 6 in a corresponding relation to FIG. 3. The sums ΣPi, ΣNi, and ΣPi−ΣNi shown in FIG. 6 are the same as those shown in FIG. 3. As can be seen from FIG. 6, the output level of the quantizer 1 is equally divided by a factor of 2, or another value close to it, in the same way as in the first embodiment. One is applied to the non-inverting input terminal of the operational amplifier 6 as it is. The other is inverted and then applied to the inverting input terminal. They are interchanged at half sampling intervals. Hence, the advantages yielded by the first embodiment can be had. In addition, every element is used for an average time. Therefore, noise components due to inconsistencies of individual elements can be substantially eliminated in the same way as in the prior art DEM system.

In accordance with the embodiments of the present invention, each sampling interval of a quantizer is divided into a former half interval and a latter half interval. The output level of the quantizer is divided so as to be represented by the sum of the output levels of second and third digital signals, each of which is obtained by dividing the output level of the quantizer by a factor of 2 or an integer close to it. In the former half of each sampling interval, a level signal corresponding to an inversion of the third digital signal is subtracted from a level signal corresponding to the second digital signal. In the latter half of each sampling interval, a level signal corresponding to an inversion of the second digital signal is subtracted from a level signal corresponding to the third digital signal. Thus, an analog signal is produced. Therefore, the number of elements such as resistors and capacitors forming converter elements can be halved simply by using a clock frequency that is double the sampling frequency. This can reduce the IC chip size of the delta-sigma D/A converter. Alternatively, where the same number of elements are used as in the prior art technique, a more accurate D/A converter can be offered.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A delta-sigma D/A converter comprising:
a quantizer for producing a first digital signal of N (N is an integer equal to or greater than 3) output levels at regular sampling intervals;
a noise shaper for canceling out low-frequency components of quantization noise produced from said quantizer;
a divider for dividing said first digital signal such that it is represented in terms of the sum of output levels of second and third digital signals each indicating an output level obtained by dividing the output level of said first digital signal to a half of the output level or other integer close to the half of it; and a differential amplifier for producing an analog signal corresponding to the output level of said quantizer by subtracting an inverted level signal obtained by inverting a level signal corresponding to said third digital signal from a level signal corresponding to said second digital signal during a former halt of each of said sampling intervals and by subtracting an inverted level signal obtained by inverting a level signal corresponding to said second level signal from a level signal corresponding to said third digital signal during a latter half of each of said sampling intervals.

2. The delta-sigma D/A converter of claim 1, wherein the output level of said first digital signal is indicated by Q that is more than 0 and an integer given by (N−1), wherein said divider divides said first digital signal such that said second and third digital signals assume output levels A and B, respectively, both of Q/2 where Q is even and that said second and third digital signals assume output levels A and B, respectively, of (Q+1)/2 and (Q−1)/2 respectively, where Q is odd.

3. The delta-sigma D/A converter of claim 2, further comprising:

a first adder having L (L is an integer equal to or more than (N−4)/2) converter elements weighted equivalently, said first adder acting to receive said second digital signal during said former half of each sampling interval and to supply a unit amount to A ones of said converter elements corresponding to the level A of said second digital signal to add said unit amount in an analog manner, thereby producing said level signal corresponding to said second digital signal, said first adder acting to receive said third digital signal during said latter half of each sampling interval, to supply a unit amount to B ones of said converter elements corresponding to the level B of said third digital signal, and to add said unit amount, thereby producing said level signal corresponding to said third digital signal; and a second adder having L converter elements weighted equivalently, said second adder acting to receive said third digital signal during said former half of each sampling interval and apply a unit amount to (L-B) ones of said converter elements corresponding to the level B of said third digital signal to add said unit amount in an analog manner, thereby producing said inverted level signal corresponding to said third digital signal, said second adder acting to receive said second digital signal during said latter half of each sampling interval, to supply a unit amount to (L-A) ones of said converter elements corresponding to the level A of said second digital signal to add said unit amount in an analog manner, thereby producing said inverter level signal corresponding to said second digital signal.

* * * * *